(12) United States Patent
Crenshaw et al.

(10) Patent No.: US 6,496,352 B2
(45) Date of Patent: *Dec. 17, 2002

(54) POST-IN-CROWN CAPACITOR AND METHOD OF MANUFACTURE

(75) Inventors: Darius L. Crenshaw, Allen, TX (US); William F. Richardson, Richardson, TX (US); Rick L. Wise, Plano, TX (US)

(73) Assignee: Texas Instruments Incorporated, Dallas, TX (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/335,348

(22) Filed: Jun. 17, 1999

(65) Prior Publication Data

US 2002/0057548 A1 May 16, 2002

Related U.S. Application Data

(60) Provisional application No. 60/091,302, filed on Jun. 30, 1998.

(51) Int. Cl.⁷ ............................................. H01G 4/005
(52) U.S. Cl. ................. 361/303; 361/303; 361/305; 438/253; 438/254; 438/309; 438/396; 257/308; 257/309
(58) Field of Search ................................ 361/303, 308, 361/311, 313; 438/254, 309, 396, 397, 325, 238, 239, 255, 256, 253; 257/308, 309, 534

(56) References Cited

U.S. PATENT DOCUMENTS

| | | | | |
|---|---|---|---|---|
| 5,712,202 A | * | 1/1998 | Liaw et al. | 438/253 |
| 5,847,460 A | * | 12/1998 | Liou et al. | 257/751 |
| 5,849,619 A | * | 12/1998 | Cho et al. | 438/254 |
| 5,854,105 A | * | 12/1998 | Tseng | 438/253 |
| 5,907,774 A | * | 5/1999 | Wise | 438/254 |
| 6,008,514 A | * | 12/1999 | Wu | 257/308 |
| 6,010,942 A | * | 1/2000 | Chien et al. | 438/396 |
| 6,146,968 A | * | 11/2000 | Lu et al. | 438/398 |

* cited by examiner

*Primary Examiner*—Dean A. Reichard
*Assistant Examiner*—Nguyen T Ha
(74) *Attorney, Agent, or Firm*—W. James Brady; Frederick J. Telecky, Jr.

(57) ABSTRACT

A post-in-crown capacitor is disclosed. The post-in-crown capacitor (60) includes a crown (44) coupled to a conductive via (20). A post (48) is disposed within the crown (44) and a capacitor insulation layer (50) is formed outwardly from the crown (44) and the post (48). A capacitor plate layer (52) is then formed outwardly from the capacitor insulation layer (50).

10 Claims, 7 Drawing Sheets

POST-IN-CROWN CAPACITOR AND METHOD OF MANUFACTURE

This application claims priority under 35 USC §119(e)(1) of provisional application No. 60/091,302 filed Jun. 30, 1998.

TECHNICAL FIELD OF THE INVENTION

This invention relates generally to the field of microelectronic devices, and more particularly to a post-in-crown capacitor and method of manufacture.

BACKGROUND OF THE INVENTION

Electronic equipment such as televisions, telephones, radios, and computers are often constructed using semiconductor components, such as integrated circuits, memory chips, and the like. The semiconductor components are typically constructed from various microelectronic devices fabricated on a semiconductor substrate, such as transistors, capacitors, diodes, resistors, and the like. Each microelectronic device is typically a pattern of conductive, semiconductive, and insulative regions formed on the semiconductor substrate.

A capacitor is one such microelectronic device that is used in a number of applications. Each capacitor has an associated capacitance and a switching speed. The capacitance is indicative of the maximum charge that can be stored in the capacitor; and the switching speed is indicative of the speed that the capacitor can be discharged and recharged. In general, the switching speed of the capacitor decreases the larger the physical size of the capacitor. In contrast, the larger the physical size of the capacitor the greater the capacitance of the capacitor.

A dynamic random access memory (DRAM) device is generally formed from an array of memory cells with each memory cell having a single transistor and a single capacitor. The capacitance of the capacitor used in a memory cell must be greater than a minimum threshold capacitance. The minimum threshold capacitance is needed because the memory cell has no internal amplification and the charge stored in the capacitor is attenuated when the memory cell is accessed. In addition, the stored charge must be greater than the resolution limit of a sensing amplifier that is used to detect the charge stored in the capacitor.

The density and switching speed of the memory cells in a dynamic random access memory device can be increased by decreasing the physical size of the individual capacitors within each memory cell. Increasing the density and switching speed of the memory cells in the dynamic random access memory device increases the computing power and speed of the dynamic random access memory device. However, reducing the size of the capacitor can reduce the capacitance of the capacitor below the minimum threshold capacitance, thereby rendering the memory cell and the dynamic random access memory device inoperable.

SUMMARY OF THE INVENTION

Accordingly, a need has arisen for a post-in-crown capacitor and method of fabrication. The present invention provides a post-in-crown capacitor and method of fabrication that substantially eliminates or reduces problems associated with the prior systems and methods.

In accordance with one embodiment of the present invention, a post-in-crown capacitor is provided. The post-in-crown capacitor comprises a crown coupled to a conductive via. A post is disposed within the crown and a capacitor insulation layer is disposed on all surfaces of the post and crown. A capacitor plate layer is then formed outwardly from the capacitor insulation layer.

Important technical advantages of the present invention include providing a post-in-crown capacitor that, for a given capacitance, is physically shorter than many conventional capacitors. Accordingly, the size of the post-in-crown capacitor required to obtain the minimum threshold capacitance for a memory cell is smaller than many conventional capacitors. In addition, the smaller size of the post-in-crown capacitor allows the density of microelectronic devices that are fabricated on a given planar area of the substrate to be increased. In a particular application, the reduced size of the post-in-crown capacitor decreases the size of the memory cell and can, thereby, increase the number of memory cells in a dynamic random access memory. The increased number of memory cells increases the available memory in the dynamic random access memory array. Another technical advantage of the present invention is that the capacitance, for a given physical size, of the post-in-crown capacitor is greater than many conventional capacitors.

Yet another technical advantage of the present invention is that the switching speed of the post-in-crown capacitor is faster than many conventional capacitors. Specifically, the overall height of the post-in-crown capacitor is reduced, which reduces the distance that an electrical charge must travel in order to charge or discharge the post-in-crown capacitor. Accordingly, the switching speed of the memory cell is increased, which increases the computing speed of the dynamic random access memory device.

Other technical advantages will be readily apparent to one skilled in the art from the following figures, description and claims.

BRIEF DESCRIPTION OF THE DRAWINGS

For a more complete understanding of the present invention and its advantages thereof, reference is now made to the following description, taken in conjunction with the accompanying drawings, wherein like reference numerals represent like parts, in which.

DETAILED DESCRIPTION OF THE INVENTION

Figure 1A:
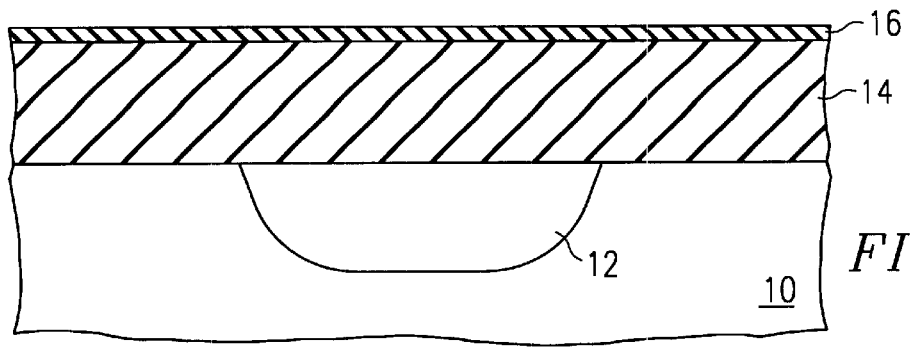
FIGS. 1A–1O are a series of schematic cross-sectional diagrams illustrating the fabrication of a post-in-crown capacitor in accordance with the present invention.
Figure 1B:
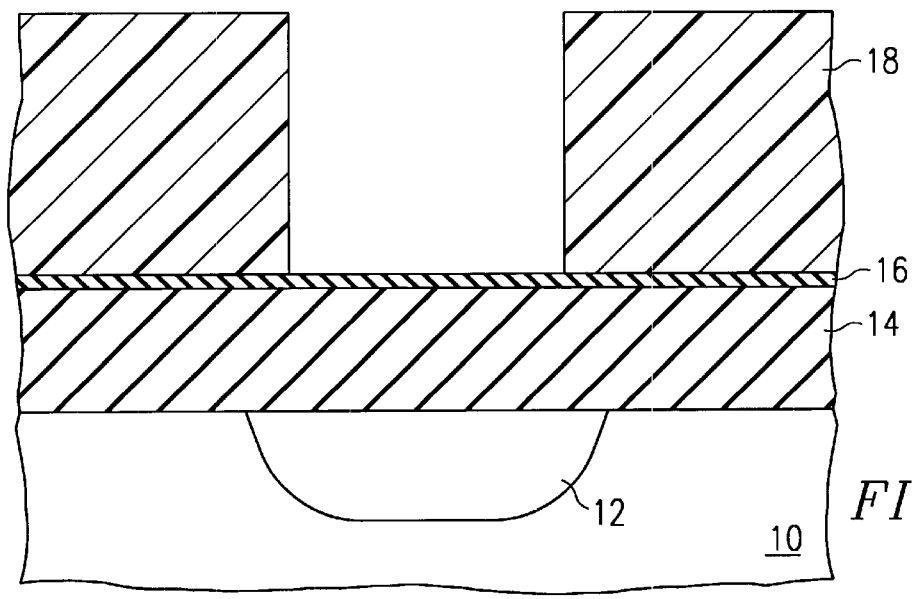
Figure 1C:
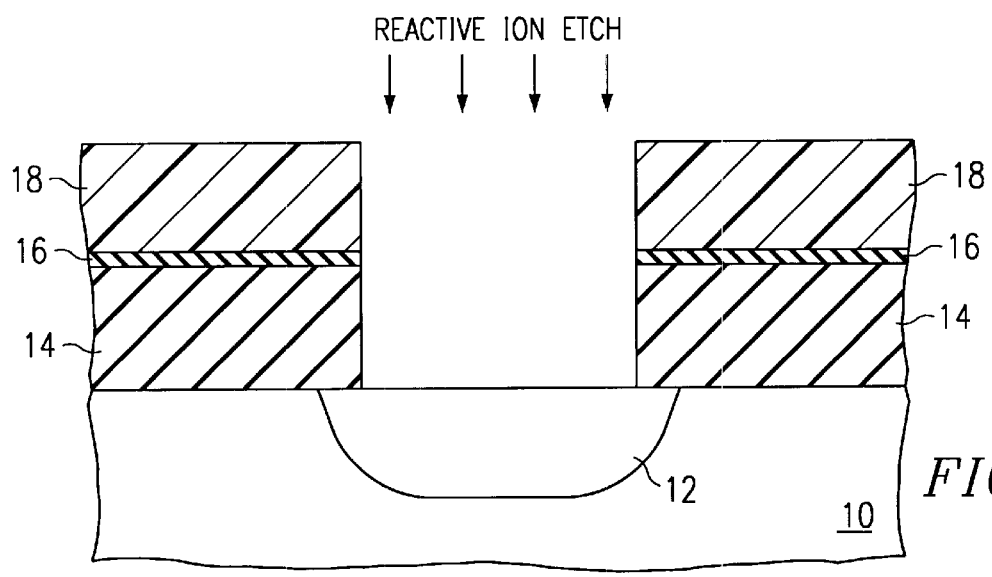
Figure 1D:
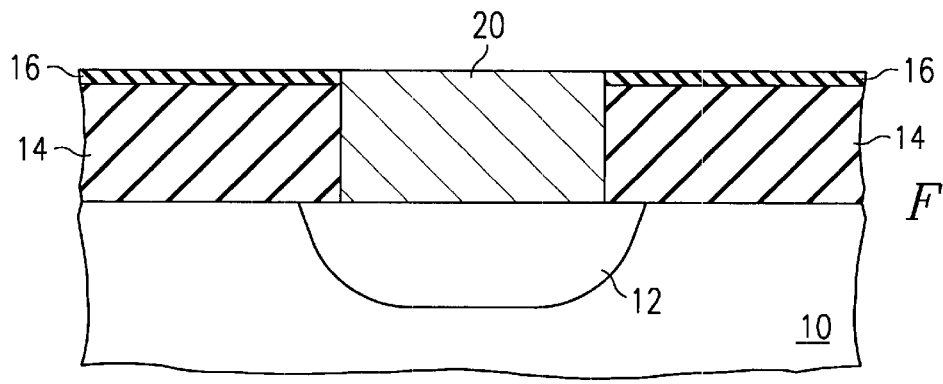
Figure 1E:
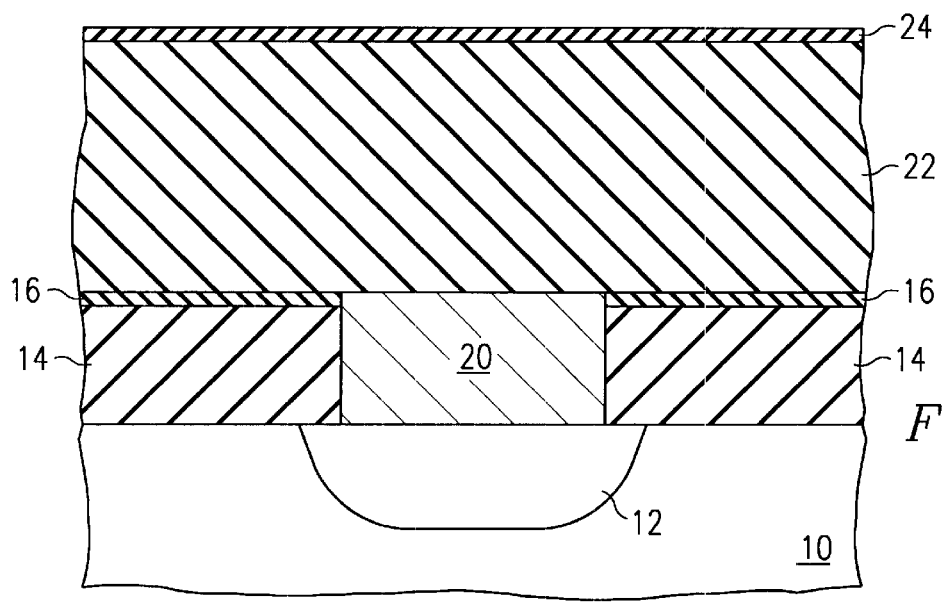
Figure 1F:
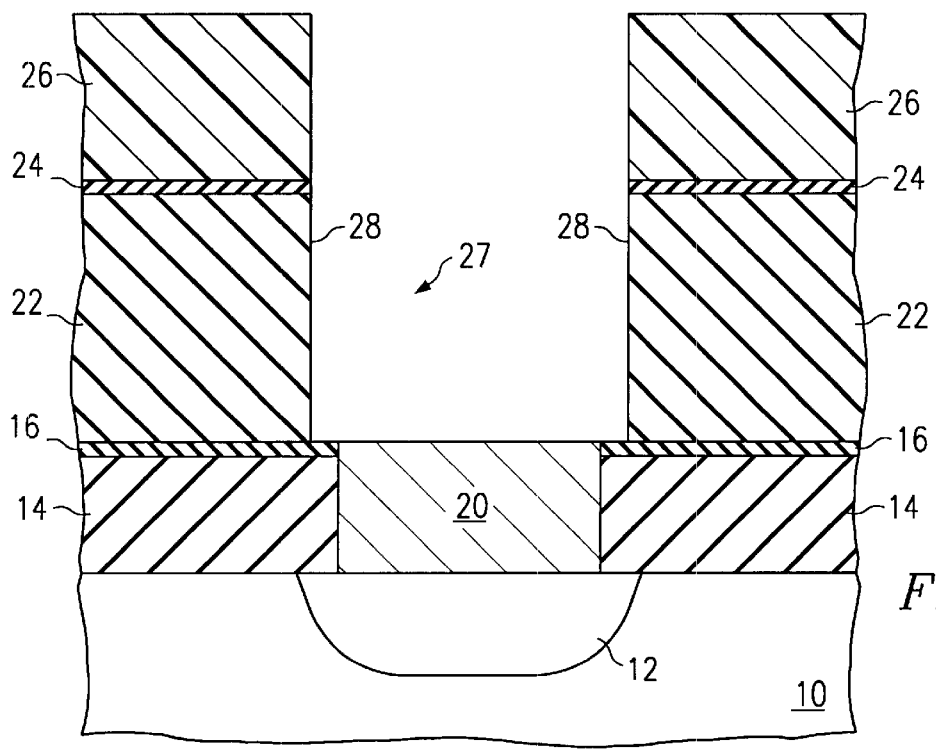
Figure 1G:
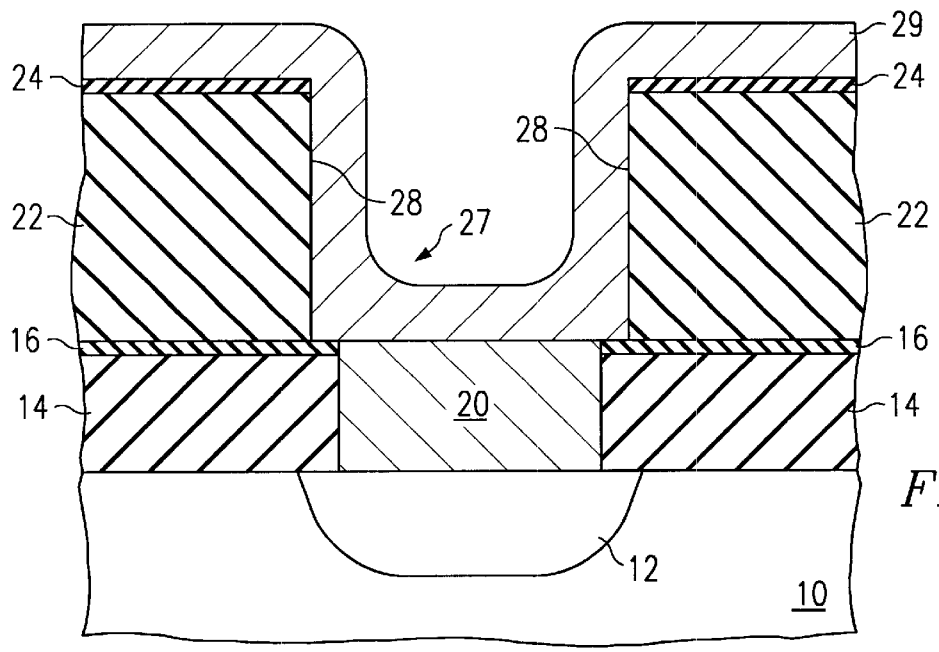
Figure 1H:
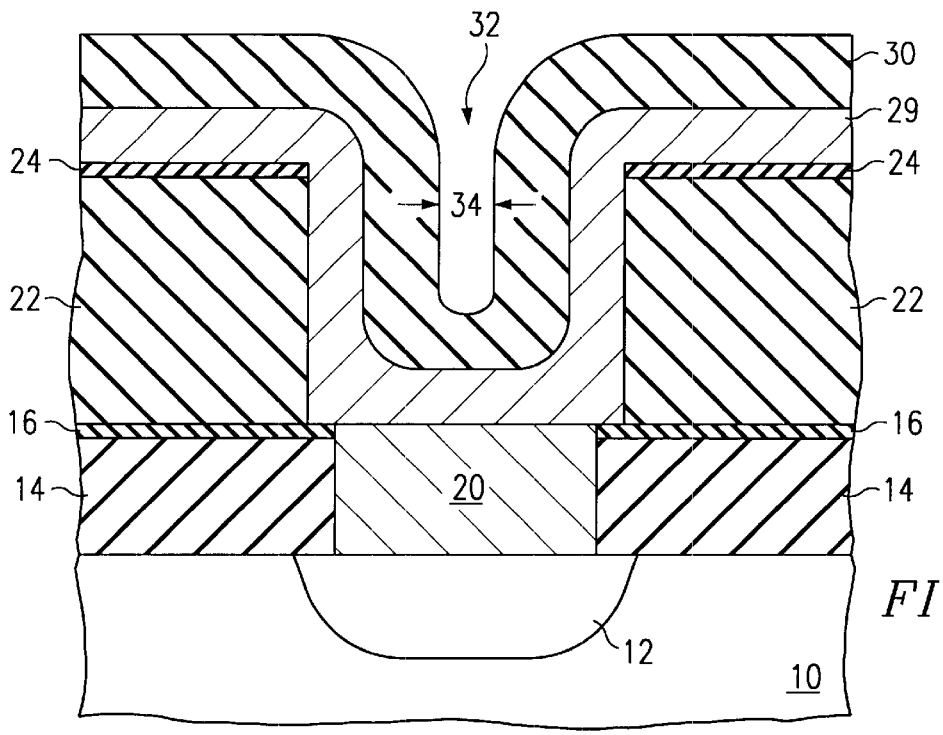
Figure 1I:
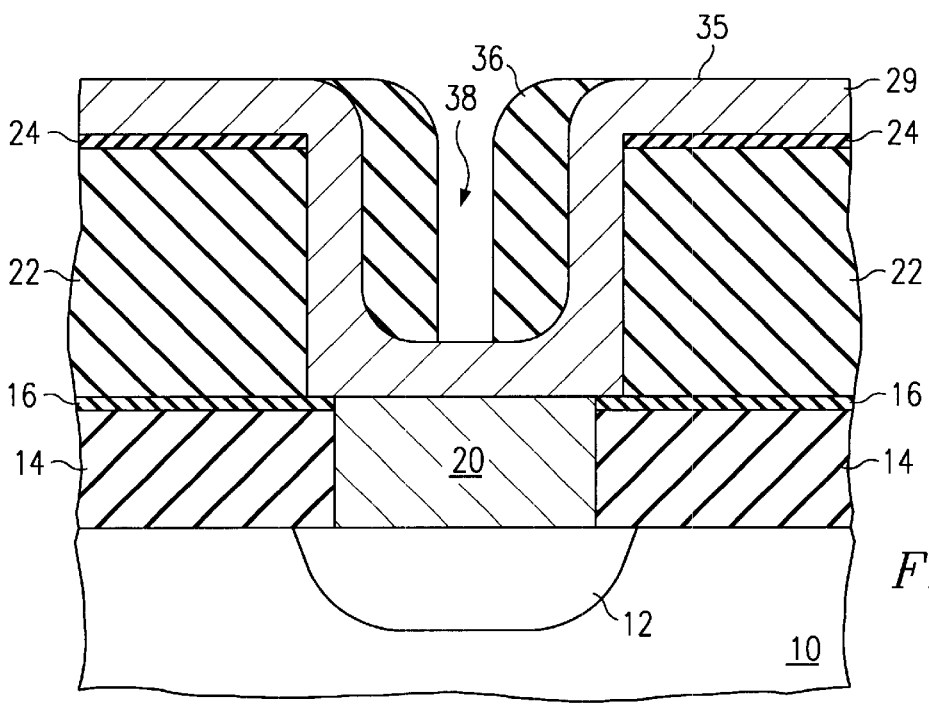
Figure 1J:
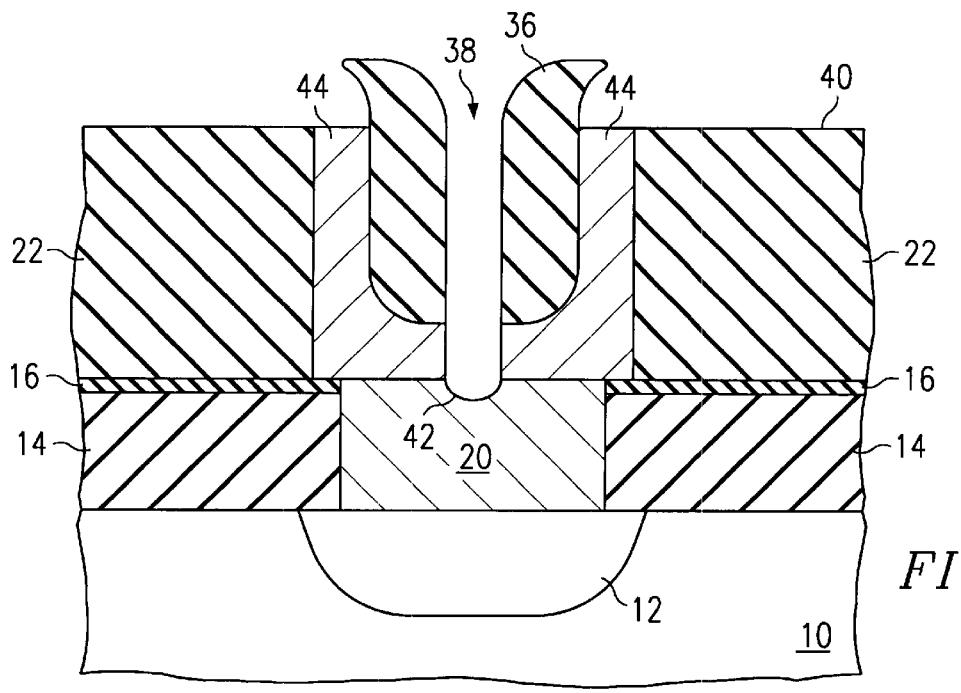
Figure 1K:
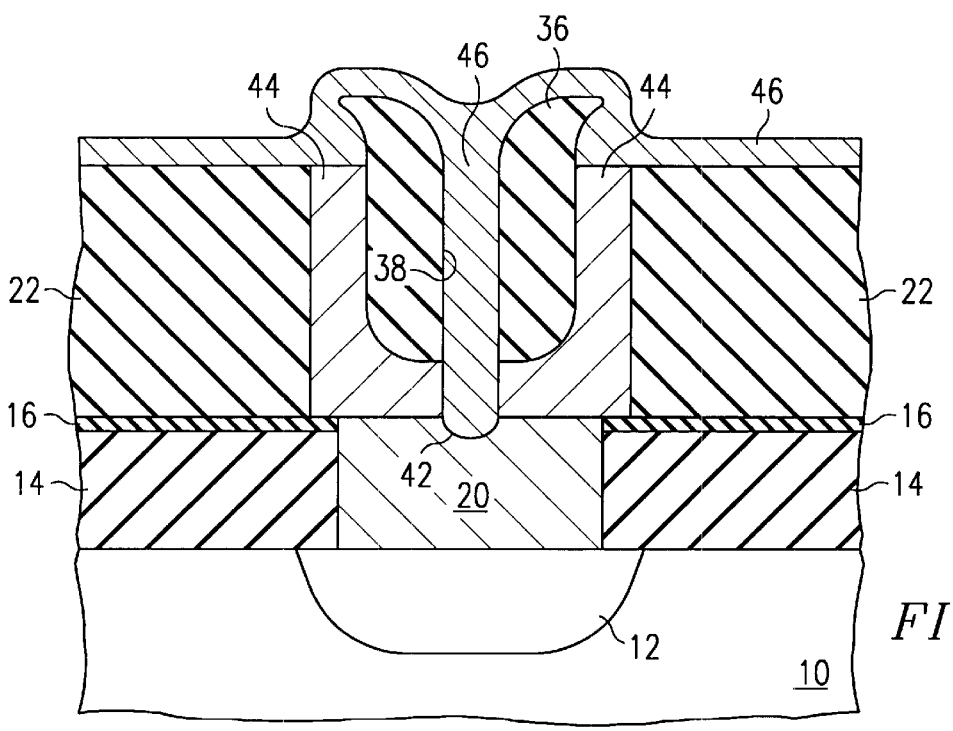
Figure 1L:
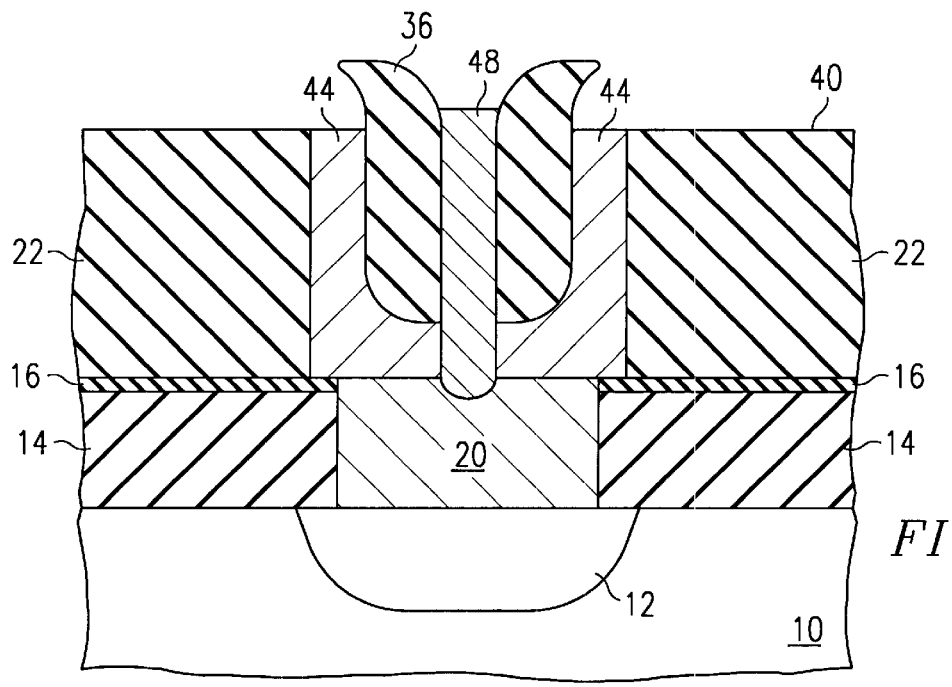
Figure 1M:
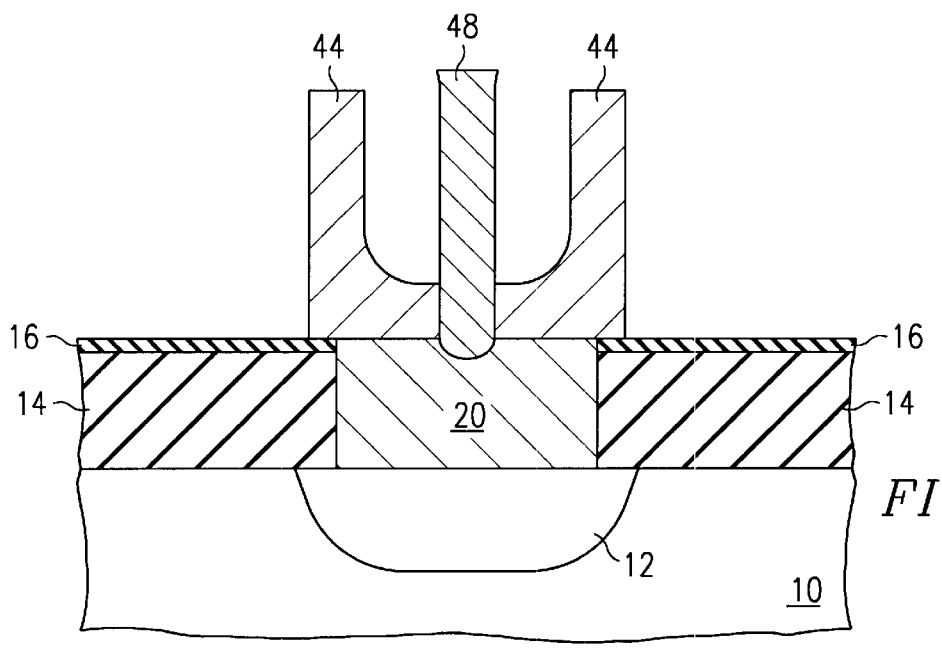
Figure 1N:
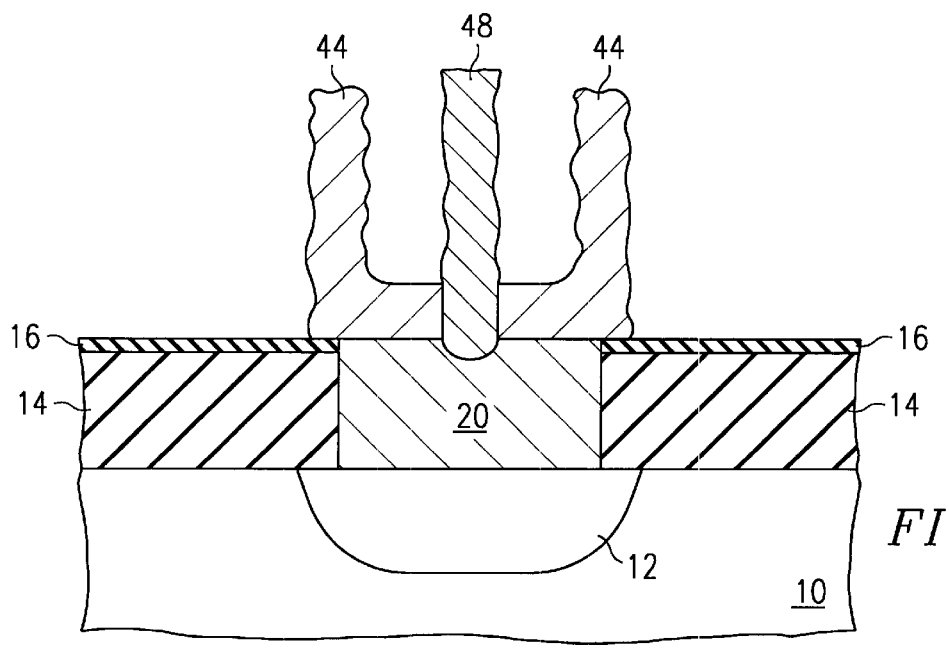
Figure 1O:
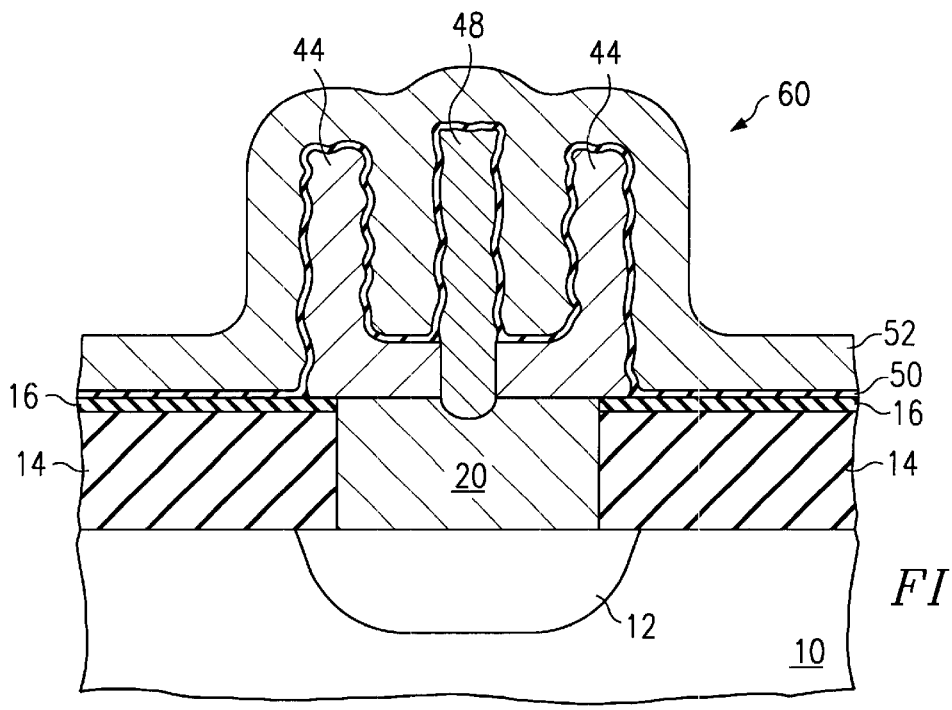

FIGS. 1A–1O illustrate one method of fabricating a post-in-crown capacitor. As described in more detail below, the post-in-crown capacitor incorporates a post into a crown of the capacitor. The post increases the available surface area of the capacitor in which to obtain a differential charge or capacitance. The increased surface area allows the height of the capacitor to be reduced for a given capacitance. Accordingly, the switching speed of a dynamic random access memory may be increased.

FIG. 1A illustrates an initial semiconductor structure having a substrate 10. In one embodiment, the substrate 10 is a wafer formed from a single-crystalline silicon material. It will be understood that the substrate 10 may comprise other suitable materials and layers without departing from the scope of the present invention. For example, the substrate 10 may include an epitaxial semiconductor layer, a recrystallized semiconductor material, a polycrystalline semiconductor material, or any other suitable material or layer.

A conductive pad region 12 may be formed within the substrate 10. The conductive pad region 12 generally comprises portions of the substrate 10 into which impurities have been introduced to form a conductive region. The conductive pad region 12 may be formed by ion implantation of impurities into the substrate 10 or by other suitable conventional doping process. It will be understood that the conductive pad region 12 may be otherwise formed without departing from the scope of the present invention.

A dielectric layer 14 is formed outwardly from the substrate 10 and the conductive pad region 12. The dielectric layer 14 is generally on the order of 2,500–7,500 Å in thickness. In one embodiment, the dielectric layer 14 comprises an oxide. It will be understood that the dielectric layer 14 may comprise other suitable insulating materials without departing from the scope of the present invention. For example, the dielectric layer 14 may comprise silicon nitride, silicon oxynitride, or other materials suitable for insulating semiconductor elements.

An optional etch-stop layer 16 may be formed outwardly from the dielectric layer 14. As will be discussed in greater detail below, the etch-stop layer 16 provides a barrier to etching into the dielectric layer 14. The etch-stop layer 16 may be on the order of 200 Å in thickness. In an embodiment in which the dielectric layer 14 comprises an oxide, the etch-stop layer 16 comprises a nitride material. It will be understood that the etch-stop layer 16 may comprise other suitable materials without departing from the scope of the present invention. For example, the etch-stop layer 16 may comprise an oxide, oxynitride, or other suitable etch-stop material.

Referring to FIG. 1B, a first photoresist mask 18 is formed outwardly from the etch-stop layer 16. The photoresist mask 18 exposes a portion of the etch-stop layer 16 that corresponds to the conductive pad region 12 disposed within the substrate 10. The first photoresist mask 18 is formed using conventional photolithographic and selective etching processes. One such photolithography technique for fabricating the first photoresist mask 18 includes applying a layer of photoresist material (not shown) outwardly from the etch-stop layer 16. The photoresist material comprises a material that cures in response to electromagnetic radiation, such as light. Electromagnetic radiation is focused through a mask pattern (not shown) onto the layer of photoresist material. The mask pattern blocks a portion of the electromagnetic radiation such that the electromagnetic radiation striking the layer of photoresist material is in a pattern. The photoresist material cures in a pattern corresponding to the pattern of electromagnetic energy striking the layer of photoresist material. The non-cured portions of the photoresist material are then removed to form the first photoresist mask 18. It will be understood that the first photoresist mask 18 may be otherwise suitably formed without departing from the scope of the present invention.

Referring to FIG. 1C, the exposed portions of the etch-stop layer 16 are then etched to expose the underlying dielectric layer 14. The etching process to remove the etch-stop layer 16 is an anisotropic etching process. Anisotropic etching may be performed using a reactive ion etch (RIE) process using carbon-fluorine based gases such as $CF_4$ or $CHF_3$. The etching process is selective to the material comprising the etch-stop layer 16. In other words, the etching process substantially removes the material comprising the etch-stop layer 16 without substantially removing the material comprising the first photoresist mask 18.

The exposed portions of the dielectric layer 14 are then etched to expose a portion of the conductive pad region 12 in the substrate 10. The etching process to remove the exposed portions of the dielectric layer 14 is an anisotropic etching similar to the process used to anisotropically etch the etch-stop layer 16. The remaining portions of the first photoresist mask 18 are then removed and the surfaces of the structure cleaned of all debris and contaminants.

Referring to FIG. 1D, a conductive via 20 is formed outwardly from the conductive pad region 12 of the substrate 10. The conductive via 20 may be fabricated by forming a conductive via layer (not expressly shown) outwardly from the etch-stop layer 16 and the exposed portion of the conductive pad region 12. The conductive via layer is then planarized, or etched back, to expose the etch-stop layer 16. The remaining portion of the conductive via layer forms the conductive via 20. In one embodiment, the conductive via 20 comprises amorphous silicon which has been doped with impurities to render the amorphous silicon conductive. It will be understood that the conductive via 20 may comprise other suitable conducting materials without departing from the scope of the present invention. For example, the conductive via 20 may comprise doped silicon, in situ doped polysilicon, or any suitable conductive material.

Referring to FIG. 1E, a first mold layer 22 is then formed outwardly from the etch-stop layer 16 and the conductive via 20. The thickness of the first mold layer is generally 5,000–15,000 Å in thickness, depending upon the size of the capacitor required for the particular application. In one embodiment, the first mold layer 22 comprises phosphosilicate glass (PSG). The first mold layer 22 may comprise other suitable dielectric materials without departing from the scope of the present invention.

An optional corner layer 24 may be formed outwardly from the first mold layer 22. As will be discussed in greater detail below, the corner layer 24 operates as a barrier during subsequent etch processes and helps to produce a sharp corner during a subsequent anisotropic etch of the first mold layer 22. In an embodiment in which the first mold layer 22 is phosphosilicate glass, the corner layer 24 may comprise undoped amorphous silicon. It will be understood that the corner layer 24 may comprise other suitable materials without departing from the scope of the present invention.

Referring to FIG. 1F, a second photoresist mask 26 is formed outwardly from the corner layer 24 and exposes a portion of the corner layer 24. The second photoresist mask 26 is formed by conventional photolithography techniques as described previously. In one embodiment, the second photoresist mask 26 is patterned with a conventional storage node hole pattern. As will be discussed in greater detail below, the storage node hole in the pattern is generally larger, in at least one dimension, than the minimum photolithography feature size. Because the storage node hole pattern is larger than the minimum photolithography feature size, photolithography masking constraints are relaxed, thereby reducing the costs associated with photolithography patterning of the post-in-crown capacitor.

The exposed portion of the corner layer 24 is removed by an anisotropic etch process. As discussed previously, the anisotropic etch process is generally a reactive ion etch process using such chemistries as $CF_4$ and $CHF_3$. Removal of the corner layer 24 expose the first mold layer 22. The exposed portion of the first mold layer 22 is then removed during an anisotropic etch process to expose the conductive via 20 and to form a slot 27 having a sidewall 28. In one embodiment, the anisotropic etch process also exposes a portion of the etch-stop layer 16, which prevents the removal of the underlying portion of the dielectric layer 14. The anisotropic etch process to remove the corner layer 24 and the first mold layer 22 is highly non-selective to the material comprising the corner layer 24 and the first mold layer 22, respectively. In other words, the anisotropic etch process readily removes a material comprising the corner layer 24 and the first mold layer 22 without substantially removing materials that comprise the other components of the capacitor.

The second photoresist mask 26 is then removed to expose the corner layer 24. A non-selective deglaze operation may be performed to remove native oxide from the exposed surface of the conductive via 20.

Referring to FIG. 1G, a crown layer 29 is conformably deposited outwardly from the corner layer 24 and the slot 27. The crown layer 29 is conformably deposited such that the thickness of the crown layer 29 deposited on the surfaces of the slot 27, including the sidewall 28, and the corner layer 24 are substantially equal. The conformal deposition of the crown layer 29 is generally performed using a chemical vapor deposition (CVD) process. The thickness of the crown layer 29 is dependent upon the size of the post-in-crown capacitor to be fabricated. In general, the thickness of the crown layer 29 is approximately one-sixth of the minimum width of the slot 27.

As will be discussed in greater detail below, the crown layer 29 must eventually consist of a conductive material. In one embodiment, the crown layer 29 is a conductive material, such as tungsten, platinum, or other suitable metallic material. In another embodiment, the crown layer 29 is an amorphous silicon material that is in situ doped with impurities to render the material conductive. In yet another embodiment, the crown layer 29 is a silicon material that has not been doped with impurities. In this embodiment, subsequent processing steps will render the silicon material conductive. It will be understood that the crown layer 29 may comprise other materials without departing from the scope of the present invention.

Referring to FIG. 1H, a second mold layer 30 is formed outwardly from the crown layer 29. The second mold layer 30 is conformably deposited such that a post cavity 32 is formed. The thickness of the second mold layer 30 may be such that the post cavity 32 has a width 34 that is substantially the same as the thickness of the crown layer 29. In one embodiment, the second mold layer 30 comprises phosphosilicate glass (PSG). The second mold layer 30 may comprise other suitable dielectric materials without departing from the scope of the present invention.

Referring to FIG. 1I, the second mold layer 30 is subjected to an anisotropic etch-back process to expose a top surface 35 of the crown layer 29. The remaining portion of the second mold layer 30 forms a core 36. The core 36 includes a center cavity 38 that exposes a portion of the crown layer 29. The etch-back process is nonselective to the material comprising the second mold layer 30. In other words, the anisotropic etch-back process substantially removes the material comprising the second mold layer 30 without substantially removing the material comprising the crown layer 29. The anisotropic etch-back process is generally a reactive ion etch (RIE) process, as previously described.

Referring to FIG. 1J, the crown layer 29 is then subjected to an anisotropic etch-back process to expose a top surface 40 of the first mold layer 22. The remaining portion of the crown layer 29 forms a crown 44. The anisotropic etch-back process may also remove the exposed portion of the crown layer 29 within the center cavity 38, such that a portion of the conductive via 20 is exposed. The crown layer 29 may be over etched such that the exposed portion of the conductive via 20 forms an over-etched cavity 42. As will be discussed in greater detail below, the over-etched cavity 42 provides additional structure stability to a subsequently formed post.

Referring to FIG. 1K, a post layer 46 is conformably deposited outwardly from the exposed surfaces of the core 36 and the top surface 40 of the first mold layer 22. The post layer 46 is generally formed by a chemical vapor deposition (CVD) process, such that the center cavity 38 and the over-etched cavity 42 are filled with the material comprising the post layer 46. In most applications, the material comprising the post layer 46 is the same material comprising the crown layer 29. In one embodiment, the post layer 46 comprises an amorphous silicon which has been in situ doped with impurities to render it conductive. In another embodiment, the post layer 46 is an undoped polysilicon or amorphous silicon which will be subsequently doped with impurities to render it conductive. It will be understood that the post layer 46 may comprise other suitable materials without departing from the scope of the present invention.

Referring to FIG. 1L, the post layer 46 may be subjected to an anisotropic etch-back process to expose the top surface 40 of the first mold layer 22. The remaining portion of the post layer 46 contained within the core 36 forms a post 48. The anisotropic etch-back process is non-selective to the material comprising the post layer 46 and selective to the material comprising the first mold layer 22. The anisotropic etch-back process is generally a reactive ion etch (RIE) process, as previously described. It will be understood that the post layer 46 may be removed to expose the first mold layer 22 by other suitable removal processes, such as a chemical-mechanical polish (CMP) process.

Referring to FIG. 1M, the first mold layer 22 and second mold layer 36 are removed to expose the etch-stop layer 16, the crown 44, and the post 48. The removal process is non-selective to the material comprising the first mold layer 22 and the second mold layer 36. In other words, the removal process to remove the first mold layer 22 substantially removes the material comprising the first mold layer 22 and the second mold layer 36 without substantially removing the material comprising the post 48, the crown 44, or the etch-stop layer 16. In an embodiment in which the first mold layer 22 is phosphosilicate glass (PSG), the removal process may be a vapor hydrofluoric acid etch process.

Referring to FIG. 1N, the crown 44 and the post 48 may be subjected to a hemispherical grain(HSG) silicon process. The hemispherical grain silicon process is used to roughen the surface of the crown 44 and the post 48. The hemispherical grain silicon process is used in an embodiment in which the crown 44 and the post 48 comprise amorphous silicon. The hemispherical grain silicon process transforms amorphous silicon, which increases the surface area of the crown 44 and the post 48. The increased surface area of the crown 44 and the post 48 increases the capacitance of the completed capacitor. It will be understood that the hemispherical grain (HSG) silicon process is not required in order to fall within the scope of the present invention. In an embodiment in which the crown 44 and the post 48 are non-conductive, the crown 44 and post 48 are subjected to a doping process by which impurities are introduced into the materials comprising the crown 44 and the post 48 to render the crown 44 and the post 48 conductive. In this embodiment, the doping process may be performed after the hemispherical grain silicon process.

Referring to FIG. 1O, a capacitor insulation layer 50 is formed outwardly from the crown 44 and the post 48. The capacitor insulation layer 50 is a dielectric material that is deposited to a thickness of approximately 100 Å or less. The capacitor insulation layer 50 is generally conformably deposited using a chemical vapor deposition (CVD) process. In one embodiment, the capacitor insulation layer is tantalum pentoxide ($Ta_2O_5$). It will be understood that the capacitor insulation layer 50 may comprise other suitable dielectric materials without departing from the scope of the present invention. For example, the capacitor insulation layer 50 may comprise a nitride/oxide (NO) material, or any other material suitable for insulating electronic components.

A capacitor plate layer 52 is then formed outwardly from the capacitor insulation layer 50. The capacitor plate layer 52 is a conductive material that forms the second of the two conductive regions of the capacitor. The capacitor plate layer 52 is generally conformably deposited using a chemical vapor deposition (CVD) process. In one embodiment, the capacitor plate layer 52 comprises polysilicon which has been in situ doped with impurities to render it conductive. The capacitor plate layer 52 may comprise other suitable conducting materials without departing from the scope of the present invention. For example, the capacitor plate layer 52 may comprise titanium nitride or any other suitable conducting material.

The crown 44 and the post 48, in conjunction with the capacitor insulation layer 50 and the capacitor plate layer 52, form a post-in-crown capacitor 60. For a given capacitance, the overall height of the crown 44 in the post-in-crown capacitor 60 can be reduced to maintain the same capacitance as compared to many conventional capacitors. The reduced height of the capacitor 60 allows a charge stored within the crown 44 and the post 48 to be charged and discharged faster than many conventional capacitors. Accordingly, the switching speed of the post-in-crown capacitor 60 is increased, which increases the processing speed and access time of a memory cell that utilizes the post-in-crown capacitor 60. It will be understood that the post-in-crown capacitor 60 may be otherwise constructed without departing from the scope of the present invention.

Although the present invention has been described in several embodiments, various changes and modifications may be suggested to one skilled in the art. It is intended that the present invention encompass such changes and modifications that fall within the scope of the appended claims.

What is claimed is:

1. A post-in-crown capacitor, comprising:

a conductive via;

a crown coupled to the conductive via;

a post disposed within the crown;

a capacitor insulation layer disposed outwardly from the crown and post;

a capacitor plate layer disposed outwardly from the capacitor insulation layer; and wherein the post and the crown comprise an amorphous silicon material that has been roughened by a hemispherical grain silicon process.

2. The post-in-crown capacitor of claim 1, wherein the post is attached to the conductive via.

3. The post-in-crown capacitor of claim 1, further comprising:

a semiconductor substrate;

a conductive pad region disposed within the substrate and coupled to the conductive via;

a dielectric layer disposed between the substrate and the crown; and an etch-stop layer disposed between the dielectric layer and the crown.

4. A post-in-crown capacitor, comprising:

a conductive via;

a single crown coupled to the conductive via;

a post disposed within the single crown;

a capacitor insulation layer disposed outwardly from the single crown and post;

a capacitor plate layer disposed outwardly from the capacitor insulation layer.

5. The post-in-crown capacitor of claim 4 wherein the post and the single crown comprise an amorphous silicon material that has been roughened by a hemispherical grain silicon process.

6. The post-in-crown capacitor of claim 4, wherein the post is attached to the conductive via.

7. The post-in-crown capacitor of claim 4, further comprising:

a semiconductor substrate;

a conductive pad region disposed within the substrate and coupled to the conductive via;

a dielectric layer disposed between the substrate and the single crown; and an etch-stop layer disposed between the dielectric layer and the single crown.

8. The post-in-crown capacitor of claim 4 wherein the single crown comprises tungsten.

9. The post-in-crown capacitor of claim 4 wherein the single crown comprises platinum.

10. The post-in-crown capacitor of claim 4 wherein the post and the single crown comprise a same material.

* * * * *